US006367486B1

(12) United States Patent
Lee et al.

(10) Patent No.: US 6,367,486 B1
(45) Date of Patent: *Apr. 9, 2002

(54) ETHYLENEDIAMINETETRAACETIC ACID OR ITS AMMONIUM SALT SEMICONDUCTOR PROCESS RESIDUE REMOVAL PROCESS

(75) Inventors: Wai Mun Lee; Zhefei Jessie Chen, both of Fremont, CA (US)

(73) Assignee: EKC Technology, Inc., Hayward, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/635,650

(22) Filed: Aug. 10, 2000

Related U.S. Application Data

(60) Division of application No. 08/833,382, filed on Apr. 14, 1997, which is a continuation-in-part of application No. 08/628,060, filed on Apr. 17, 1996, now Pat. No. 6,187,750, which is a continuation-in-part of application No. 08/078,657, filed on Jun. 21, 1993, now abandoned, which is a continuation-in-part of application No. 07/911,102, filed on Jul. 9, 1992, now Pat. No. 5,334,332, which is a continuation-in-part of application No. 07/610,044, filed on Nov. 5, 1990, now Pat. No. 5,279,771.

(51) Int. Cl.[7] .............................. B08B 3/04; B08B 3/08; C11D 3/30; C11D 3/43
(52) U.S. Cl. ..................... 134/1.3; 510/175; 510/176; 510/245; 510/255; 510/264; 510/266; 510/499; 134/39; 134/40
(58) Field of Search .................. 510/175, 176, 510/245, 255, 264, 266, 499; 134/1.3, 39, 40

(56) References Cited

U.S. PATENT DOCUMENTS

| 4,395,348 A | | 7/1983 | Lee | 252/143 |
| 4,824,763 A | | 4/1989 | Lee | 430/258 |
| 5,279,771 A | | 1/1994 | Lee | 252/548 |
| 5,334,332 A | * | 8/1994 | Lee | 252/548 |
| 5,381,807 A | | 1/1995 | Lee | 134/2 |
| 5,399,464 A | | 3/1995 | Lee | 430/329 |
| 5,466,389 A | * | 11/1995 | Iiardi et al. | 252/156 |
| 5,482,566 A | * | 1/1996 | Lee | 134/42 |
| 5,561,105 A | | 10/1996 | Honda | 510/178 |
| 5,814,591 A | | 9/1998 | Mills et al. | 510/238 |
| 5,954,890 A | * | 9/1999 | Smith et al. | 134/38 |
| 5,989,353 A | * | 11/1999 | Skee et al. | 134/2 |
| 6,000,411 A | * | 12/1999 | Lee | 134/1.2 |

* cited by examiner

Primary Examiner—Gregory Delcotto
(74) Attorney, Agent, or Firm—Pennie & Edmonds LLP

(57) ABSTRACT

An ethylenediaminetetraacetic acid or a mono-, di-, tri- or tetraammonium salt thereof residue cleaning composition removes photoresist and other residue from integrated circuit substrates. The balance of the composition is desirably made up of water, preferably high purity deionized water, or another suitable polar solvent. A process for removing photoresist or other residue from a substrate, such as an integrated circuit semiconductor wafer including titanium metallurgy, comprises contacting the substrate with the composition for a time and at a temperature sufficient to remove the photoresist or other residue from the substrate. Use of the ethylenediaminetetraacetic acid or a mono-, di-, tri- or tetraammonium salt thereof in the composition and process provides superior residue removal without attacking titanium or other metallurgy, oxide or nitride layers on the substrate.

21 Claims, 23 Drawing Sheets

ETHYLENEDIAMINETETRAACETIC ACID OR ITS AMMONIUM SALT SEMICONDUCTOR PROCESS RESIDUE REMOVAL PROCESS

ORIGIN OF THE INVENTION

This application is a division of application Ser. No. 08/833,382 pending, filed Apr. 14, 1997, which is a continuation-in-part of application Ser. No. 08/628,060, filed Apr. 17, 1996, now U.S. Pat. No. 6,187,750 which is in turn a continuation-in-part of application Ser. No. 08/078,657, filed Jun. 21, 1993, now abandoned, which is in turn a continuation-in-part of application Ser. No. 07/911,102, filed Jul. 9, 1992, now U.S. Pat. No. 5,334,332, which was a continuation-in-part of application Ser. No. 07/610,044, filed Nov. 5, 1990, now U.S. Pat. No. 5,279,771. The disclosures of those applications are hereby incorporated by reference in this application.

BACKGROUND OF THE INVENTION

1. Field of the Invention

The present invention relates generally to a cleaning composition and process for removal of organic, organometallic and metal oxide residues from substrates. More particularly, it relates to such a composition and process for removing semiconductor device fabrication residues from semiconductor device substrates, such as etching residues after plasma etching processes in the fabrication of integrated circuits on silicon wafers and similar processes. Most especially, it relates to such a composition and process which is effective for the removal of these materials while avoiding substantial attack on metal or insulation layers employed in integrated circuits, including titanium layers.

2. Description of the Prior Art

As integrated circuit manufacturing has become more complex and the dimensions of circuit elements fabricated on silicon or other semiconductor wafers have become smaller, continued improvement in techniques used to remove residues formed from such materials has been required. Oxygen plasma oxidation is often used for removal of photoresist or other polymeric materials after their use during the fabrication process has been completed. Such high energy processes typically result in the formation of organometallic and other residues on sidewalls of the structures being formed in the fabrication process.

A variety of metal and other layers are commonly employed in integrated circuit fabrication, including aluminum, aluminum/silicon/copper, titanium, titanium nitride, titanium/tungsten, tungsten, silicon oxide, polysilicon crystal, and the like. The use of such different layers results in the formation of different organometallic residues in the high energy processes. In addition to being effective for removing such residues, cleaning compositions should also not attack the different metallurgies or insulators used in integrated circuit fabrication.

A variety of residue removal compositions and processes suitable for integrated circuit fabrication have been developed and marketed by EKC Technology, Inc., the assignee of the present application. Some of these compositions and processes are also useful for stripping photoresist, polyamide or other polymeric layers from substrates in integrated circuit fabrication, and EKC has also developed a variety of compositions and processes for stripping such polymeric layers from substrates in integrated circuit fabrication. Such compositions and processes are disclosed in the following commonly assigned issued patents: U.S. Pat. No. 5,482,566, issued Jan. 9, 1996 to Lee; U.S. Pat. No. 5,399,464, issued Mar. 21, 1995 to Lee; U.S. Pat. No. 5,381,807, issued Jan. 17, 1995 to Lee; U.S. Pat. No. 5,334,332, issued Aug. 2, 1994 to Lee; U.S. Pat. No. 5,279,771, issued Jan. 18, 1994 to Lee; U.S. Pat. No. 4,824,763, issued Apr. 25, 1989 to Lee and U.S. Pat. No. 4,395,348, issued Jul. 26, 1983 to Lee. These compositions have achieved substantial success in integrated circuit fabrication applications. However, further development of integrated circuits and their fabrication processes have created a need for improvement in residue removal compositions and processes.

As a result of a continuous effort to decrease critical dimension size in the integrated circuit industry, such as in the fabrication of sub-micron size devices, etching residue removal and substrate compatibility with chemicals employed in wet processing is becoming more and more critical for obtaining acceptable yield in very large scale integration (VLSI) and ultra large scale integration (ULSI) processes. The composition of such etching residue is generally made up of the etched substrates, underlying substrate, photoresist and etching gases. The substrate compatibility of the wafers with wet chemicals is highly dependent on the processing of the polysilicon, multilevel interconnection dielectric layers and metallization in thin film deposition, etching and post-etch treatment of the wafers, which are often quite different from one fabrication process to another. Some of the above compositions have produced corrosion on certain metal or insulator substrates, such as those including a titanium metal layer. Titanium has become more widely used in semiconductor manufacturing processes. It is employed both as a barrier layer to prevent electromigration of certain atoms and as an antireflective layer on top of other metals.

SUMMARY OF THE INVENTION

Accordingly, it is an object of this invention to provide an improved composition for residue removal and process using such a composition suitable for meeting current semiconductor fabrication requirements.

It is another object of the invention to provide such a composition and process which is suitable for removing residues from wafers and other substrates including one or more titanium metal layers without substantial attack on such titanium layers.

The attainment of these and related objects may be achieved through use of the residue removal composition and process herein disclosed. A residue removal composition in accordance with this invention comprises ethylenediaminetetraacetic acid or a mono-, di-, tri- or tetraammonium salt thereof and water or a polar organic solvent. A process for removing a residue from a substrate in accordance with this invention comprises contacting the substrate with a composition that contains ethylenediaminetetraacetic acid or a mono-, di-, tri- or tetraammonium salt thereof for a time and at a temperature sufficient to remove the residue from the substrate. When the ethylenediaminetetraacetic acid is used in its acid form, it can either be employed alone as the principal active ingredient or in combination with ammonia to form ammonium salt in situ.

In practice, we have found that use of an ethylenediaminetetraacetic acid or a mono-, di-, tri- or tetraammonium salt thereof gives a residue removing composition that attacks titanium, for example, at least about 3 times less than prior compositions. At the same time, the ethylenediaminetetraacetic acid or a mono-, di-, tri- or tetraammonium salt thereof containing composition gives at least equivalent performance as a residue removing composition to prior art cleaning compositions.

The attainment of the foregoing and related objects, advantages and features of the invention should be more readily apparent to those skilled in the art, after review of the

DETAILED DESCRIPTION OF THE INVENTION

Figure 1A:
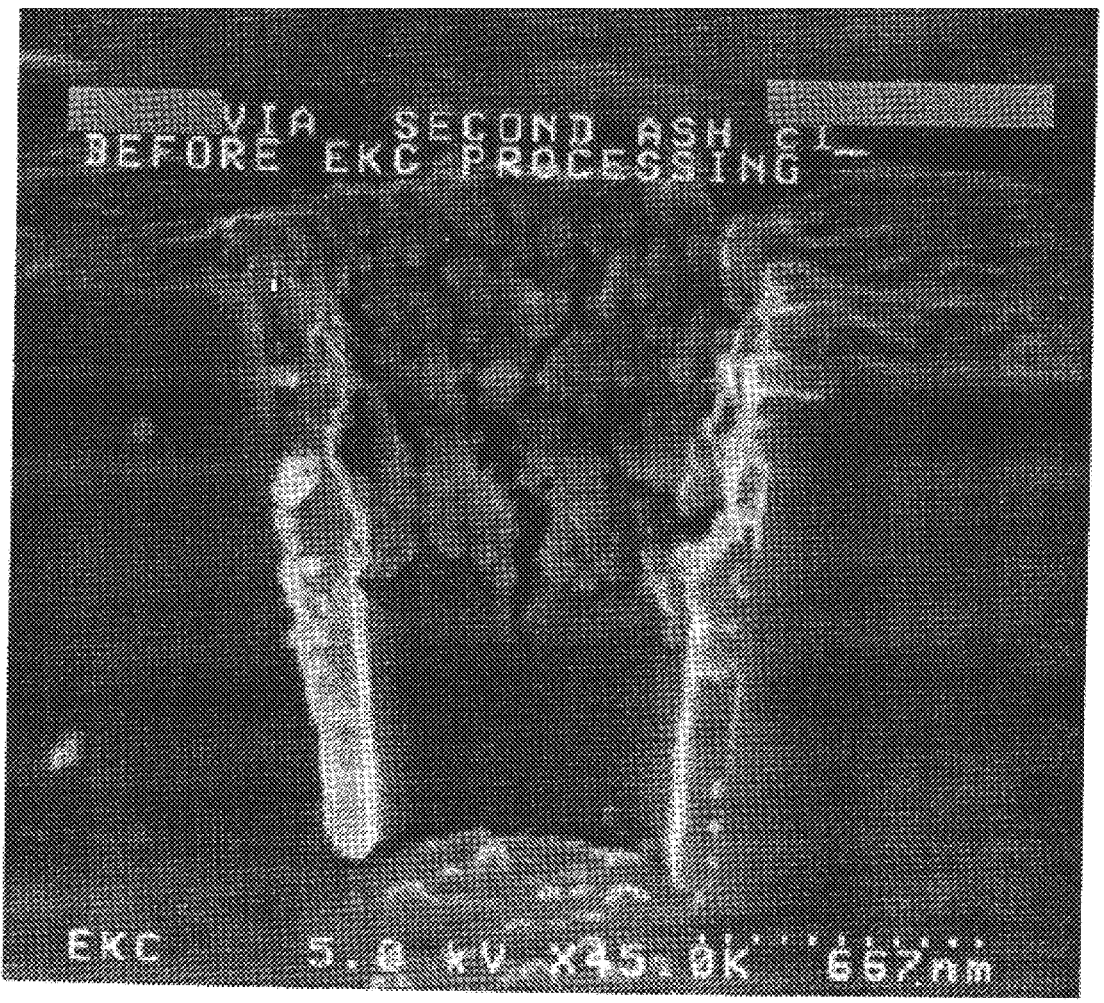
FIGS. 1A–9C are scanning electron microscope (SEM) photographs showing comparative results achieved using the composition and process of the present invention.

The ethylenediaminetetraacetic acid (EDTA) or a mono-, di-, tri- or tetraammonium salt thereof suitable for use in the invention preferably have relatively high decomposition temperatures. Preferred higher decomposition temperature specific examples of such EDTA salts include diammonium EDTA and tetraammonium EDTA.

The composition desirably contains at least about 1 to 50% by weight of at least one ethylenediaminetetraacetic acid or a mono-, di-, tri- or tetraammonium salt thereof; optionally, from about 25% to about 75% by weight of one or more amines or alkanolamines; optionally, from about 25% to about 75% percent by weight of an organic polar solvent; optionally, from about 0.15% to about 10% by weight of an organic or inorganic ammonium salt; optionally, from about 5% to about 25% by weight of an additional chelating agent, such as catechol or gallic acid; and from about 25% to about 75% by weight of water (e.g., as part of the EDTA or its ammonium salt). When ethylenediaminetetraacetic acid is employed in the acid form, the composition may optionally contain from about 1% to about 10% percent by weight of ammonia.

Ethylenediaminetetraacetic acid (EDTA) is one of the most widely used chelating agents in the world. Its ammonium salts, soluble in water and most of the organic solvents, should be stronger chelants than EDTA due to extra ammonium chelating sites. These organic ammonium salts are good starting chemicals for ammonium based integrated circuit cleaning formulations.

Suitable amines for the composition include ethylene diamine, diethylene triamine, 2-methyleneaminopropylenediamine, and the like.

Examples of suitable alkanolamines for the composition include monoethanolamine, diethanolamine, triethanolamine, tertiarybutyldiethanolamine, isopropanolamine, diisopropanolamine (2-amino-1-propanol, 1-amino-2-propanol), triisopropanolamine, 3-amino-1-propanol, isobutanolamine, 2-(2-aminoethoxy) ethanol (diglycolamine), 2-amino-2-ethoxy-propanol, methylethanol amine, N,N-diethyl hydroxylamine, and the like.

Suitable examples of polar solvents for the composition, in addition to water, include dimethyl sulfoxide, ethylene glycol, ethylene glycol alkyl ether, diethylene glycol alkyl ether, triethylene glycol alkyl ether, propylene glycol, propylene glycol alkyl ether, N-substituted pyrrolidone, sulfolane, dimethyl acetamide, and the like. Additional polar solvents as known in the art can also be used in the composition of the present invention.

Suitable examples of ammonium salts for the composition include organic ammonium salts in addition to EDTA ammonium salts, such as ammonium tartrate, ammonium citrate, ammonium formate; ammonium glucomate; inorganic ammonium salts, such as ammonium fluoride, ammonium nitrate, ammonium thiosulfate, ammonium persulfate, ammonium bicarbonate, ammonium phosphate, and the like.

The residue cleaning compositions of the present composition are effective in removing organometallic and metal oxide residue from a variety of integrated circuit silicon wafer substrates, including metal layers, such as aluminum or titanium, oxide layers, such as silicon oxides, nitride layers, such as silicon nitride, and the like. The cleaning compositions of the present invention are also effective in removing organometallic and metal oxide residue generated on the substrate of etching equipment utilized in the fabrication of integrated circuits. Examples of commercially available etching equipment include that available from Lam Research, Tegal, Electrotech, Applied Materials, Tokyo Electron, Hitachi and the like.

The method of cleaning a substrate using the cleaning compositions of the present invention involves contacting a substrate having organometallic and metal oxide residue thereon with a stripping and cleaning composition of the present invention for a time and at a temperature sufficient to remove the residue. The substrate is generally immersed in the stripping and cleaning composition. The time and temperature are determined based on the particular material being removed from a substrate. Generally, the temperature is in the range of from about ambient or room temperature to about 120° C. and the contact time is from about 2 to 60 minutes.

The substrate may then be rinsed in a polar solvent, such as isopropyl alcohol, followed by a deionized water rinse. The substrate is then mechanically dried, such as with a spin drier, or nitrogen blow dried.

The following represent non-limiting examples and describe the invention further.

Examples of cleaning compositions according to the present invention suitable for removing resist or other organic residues from a substrate are set forth in Table I below.

TABLE 1

| Cleaning Composition | EDTA or Salt Wt. % | Other Component Wt. % | Alkanol/ Amine Wt. % | Solvent Wt % |
|---|---|---|---|---|
| A | 17.5% TAE | 5% Catechol | 60% DGA | 17.5% Water |
| B | 5% DAE | 5% Citric Acid | 12.5% HDA; 5% MEA | 72.5% Water |
| C | 5% DAE | | 17.5% HDA; 60% DGA; | 17.5% Water |
| D | 5% EDTA | | 15% HDA; 10% DHA | 15% Water, 55% DMSO |
| E | 5% DAE | | 15% HDA; 10% DHA | 15% Water, 55% DMSO |
| F | 5% DAE | | 20% HDA; | 20% Water, 55% DMSO |
| G | 5% TAE | | 20% HDA; | 20% Water; 55% DMAC |
| H | 13% EDTA | 5% Catechol 3% NH3 (28–30% Aq. Sol'n) | 60% DGA | 19% Water |

Abbreviations:
EDTA = ethylenediaminetetraacetic acid
DAE = diammonium EDTA
TAE = tetraammonium EDTA
DGA = diglycolamine
HDA = hydroxylamine
MEA = monoethanolamine
DMSO = dimethylsulfoxide
DMAC = dimethylacetamide
DHA = N,N-diethyl-hydroxylamine The following experimental procedure was used with the above compositions. The chemicals were used as received. The solutions were prepared by stirring the mixture at room temperature until a clear solution was obtained. Heating was required in some cases to accelerate the solvation of solid components.

Ashed-via, unashed wafers and metal wafers with a TiN/Al—Cu/Ti/TiN/Ti or TiN/Al—Cu—Si/Ti stack were processed in these prepared cleaning solutions for 30 minutes at 45° C., 55° C. and 65° C., depending on the nature of the formulations. The wafers were broken into pieces before and after processing in these different cleaning solutions and subsequently viewed under a FE Hitachi 4500 Scanning Electron Microscope for post ash residue removal in vias and substrate compatibility on metal stacks.

EXAMPLE 1

Figure 1B:
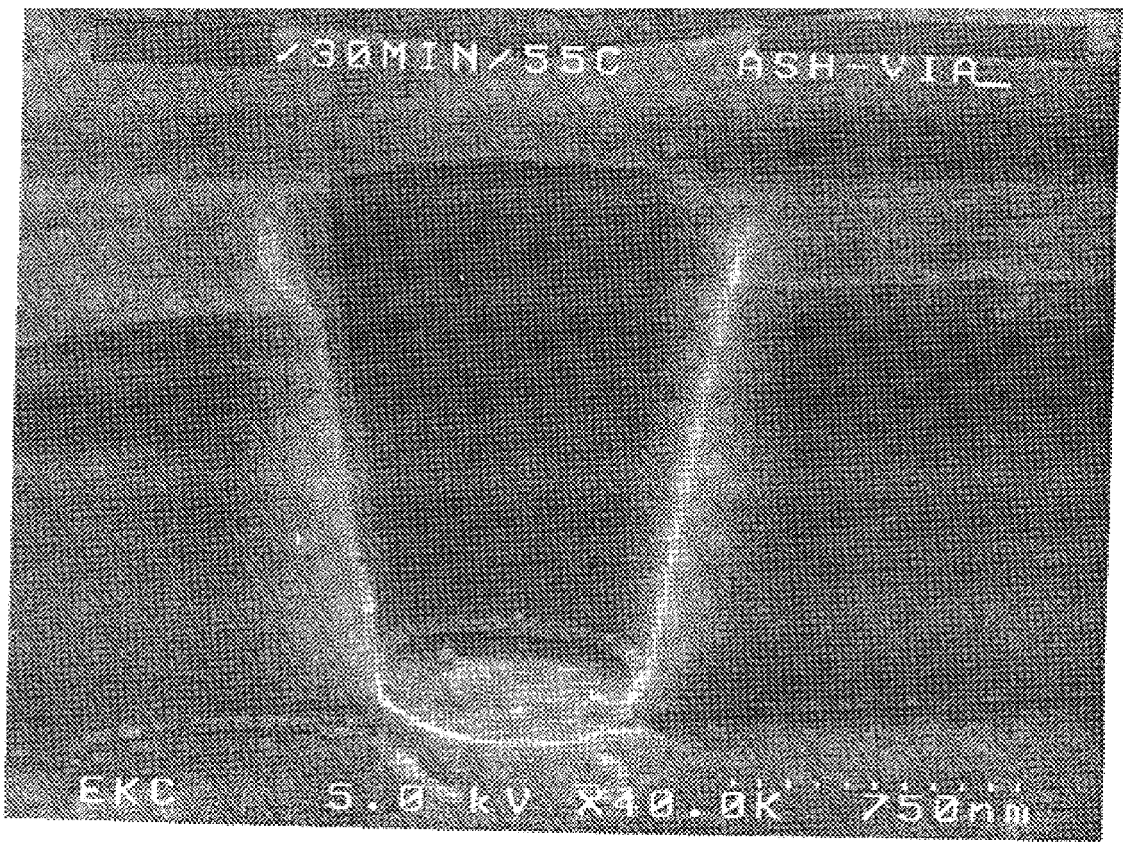

A via opening with a size of 1.2 micron in a silicon oxide dielectric layer was etched through a photoresist patterned opening using a standard silicon oxide plasma etching process. The photoresist was removed by oxygen plasma ashing. FIG. 1A is a micrograph of a scanning electron microscope (SEM) image for a representative substrate of the type used in this example, showing that heavy organometallic etch residue remained on the substrate surface, particularly around the via opening. The substrate was then processed in composition A for 30 minutes at 55° C. FIG. 1B, the resulting SEM photograph, shows that composition A removed all the organometallic residue.

EXAMPLE 2

Figure 2A:
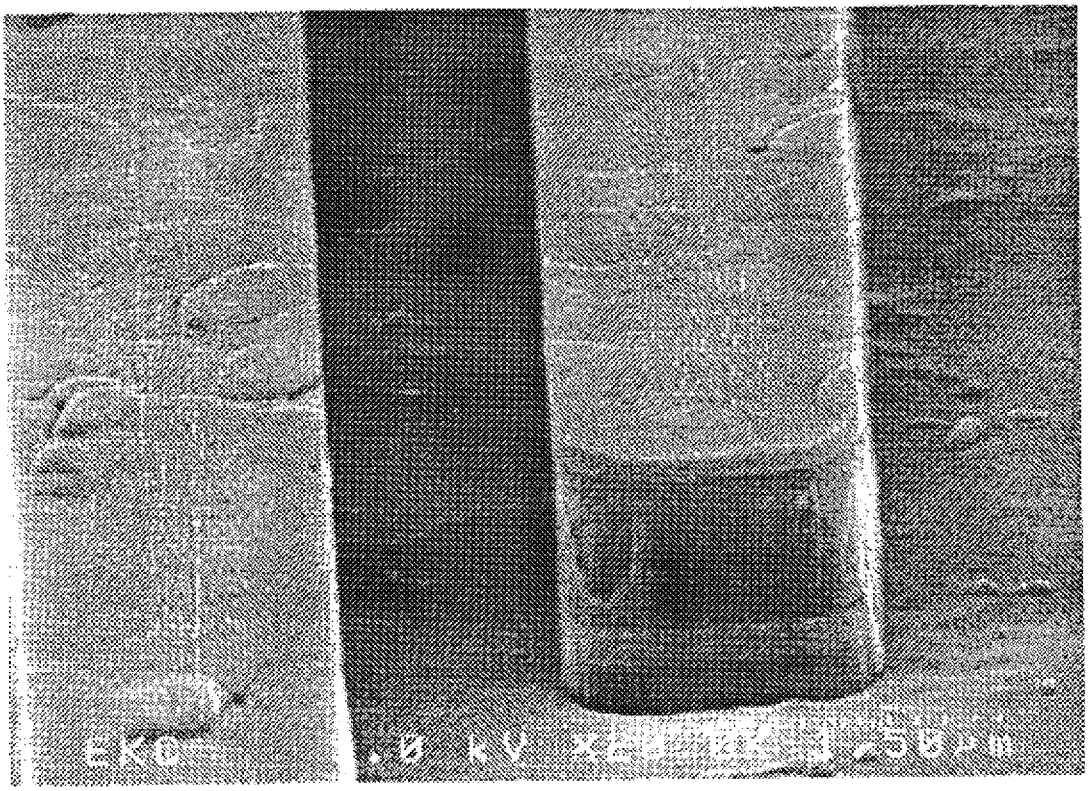
Figure 2B:
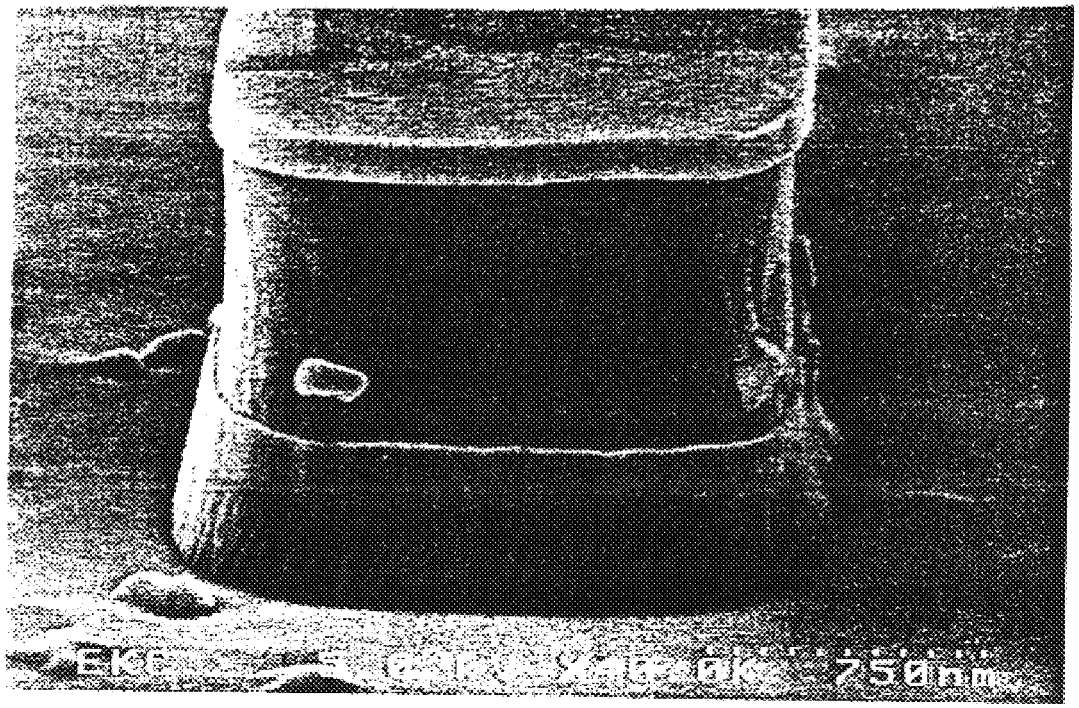

This example shows that composition A does not attack a titanium metallurgy. A sandwich metal thin film substrate of TiN/Al—Cu/Ti/TiN/Ti metallurgy was patterned and etched in a plasma metal etcher. FIG. 2A shows that there is organometallic residue left on the metal line surface after photoresist removal by oxygen plasma ashing. The wafer was exposed to composition A at 55° C. for 30 minutes, with substantially complete removal of the organometallic residue and no attack on the titanium metallurgy, as shown in FIG. 2B.

EXAMPLE 3

Figure 3A:
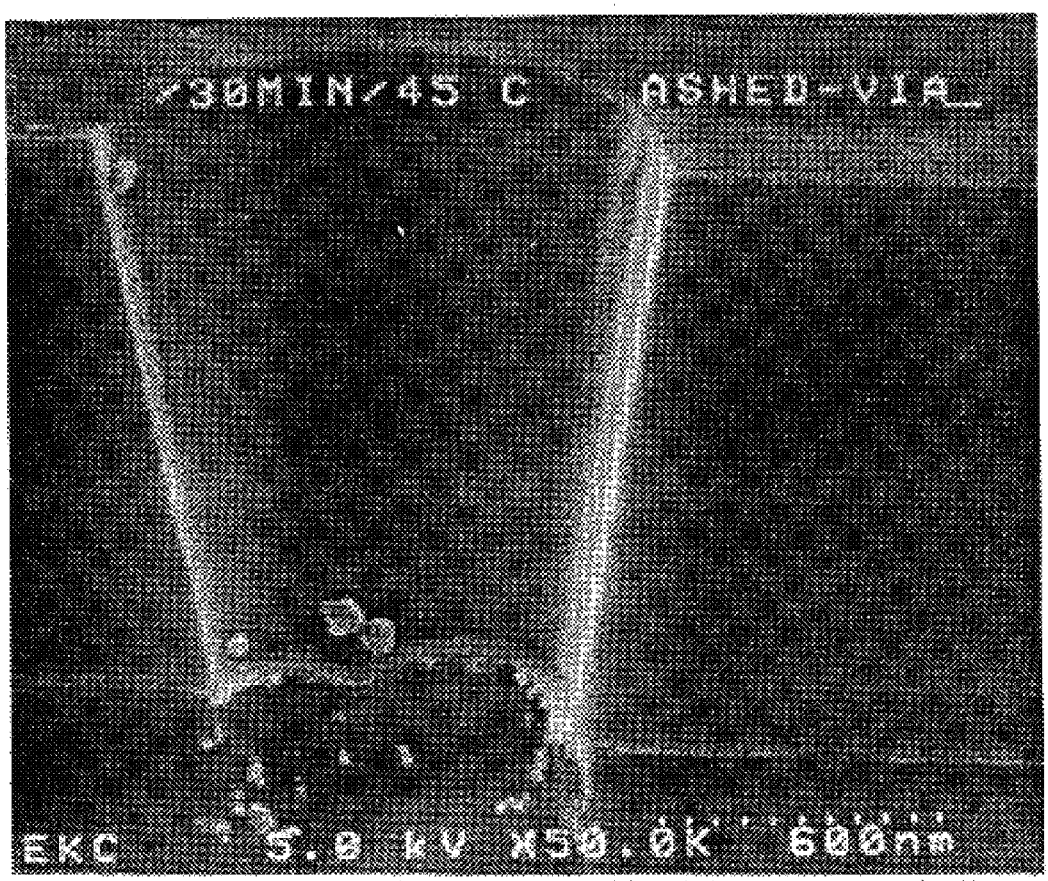
Figure 3B:
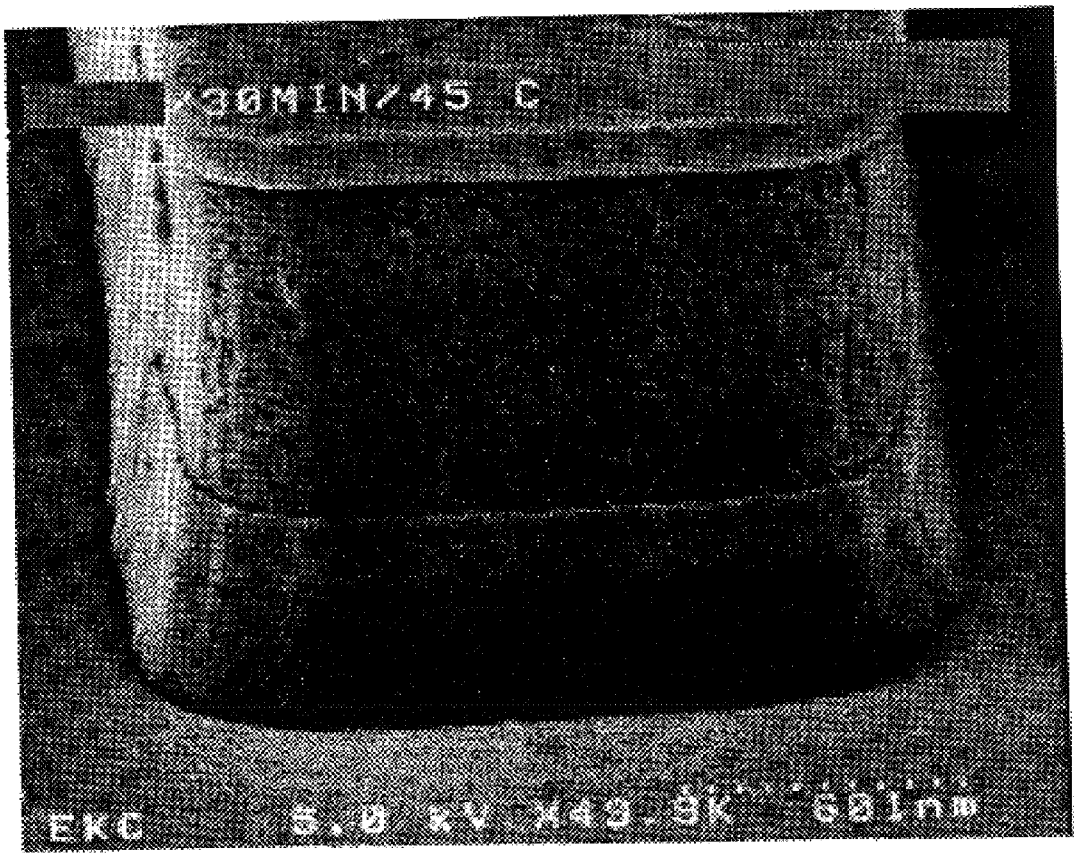

The procedures of Examples 1 and 2 were repeated with composition B but at a cleaning temperature of 45° C. FIGS. 3A and 3B show the results obtained. Approximately a 90% cleaning of the ashed via wafer was obtained, as determined by visual observation of FIG. 3A. There was either no metal corrosion or perhaps just the start of attack on the underlying aluminum metallurgy. FIG. 3B shows complete cleaning of a TiN/Al—Cu/Ti/TiN/Ti stack wafer, with no metal corrosion, or just starting to attack the aluminum layer in the stack metallurgy.

EXAMPLE 4

Figure 4A:
Figure 4B:
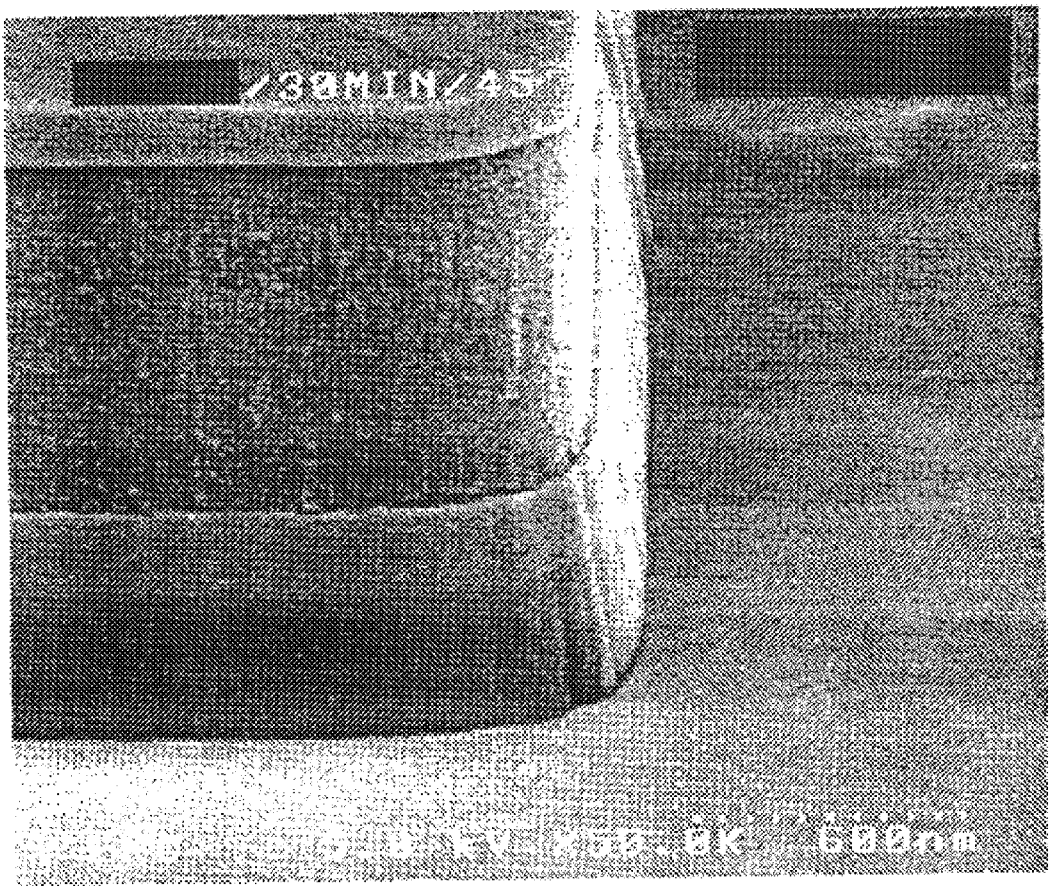

The procedures of Example 3 were repeated with composition C, also at a cleaning temperature of 45° C. FIGS. 4A and 4B show the results obtained. Complete cleaning of the ashed via wafer was obtained, as determined by visual observation of FIG. 4A. There was complete control of metal corrosion. FIG. 4B shows complete cleaning of the TiN/Al—Cu/Ti/TiN/Ti stack wafer, as shown by the clean appearance of the top TiN layer with no metal corrosion.

EXAMPLE 5

Figure 5A:
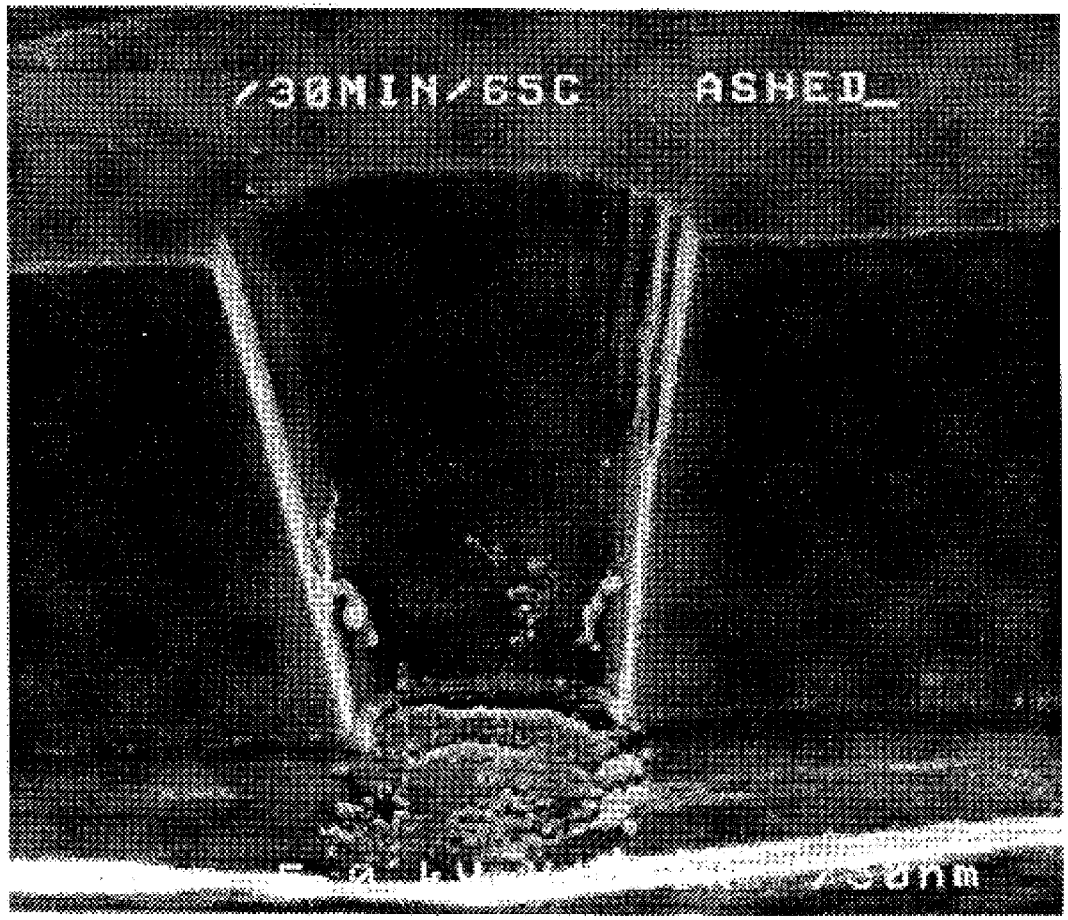
Figure 5B:
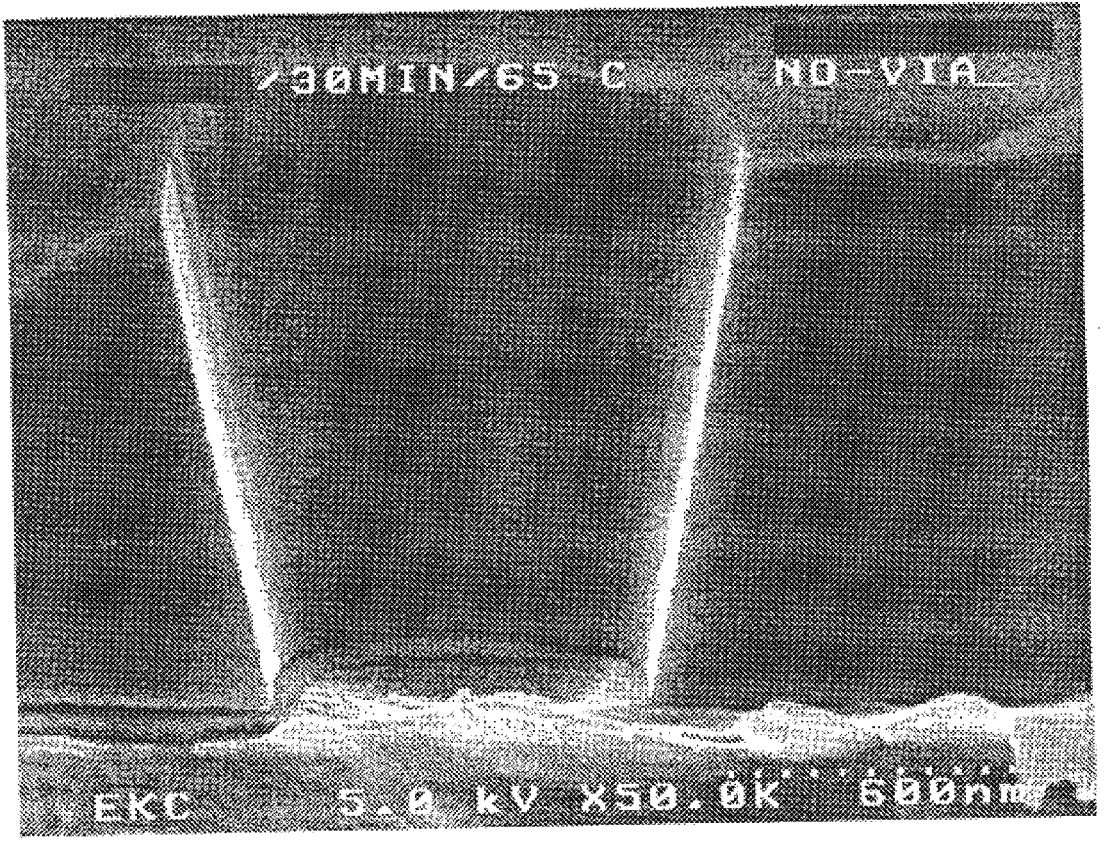
Figure 5C:
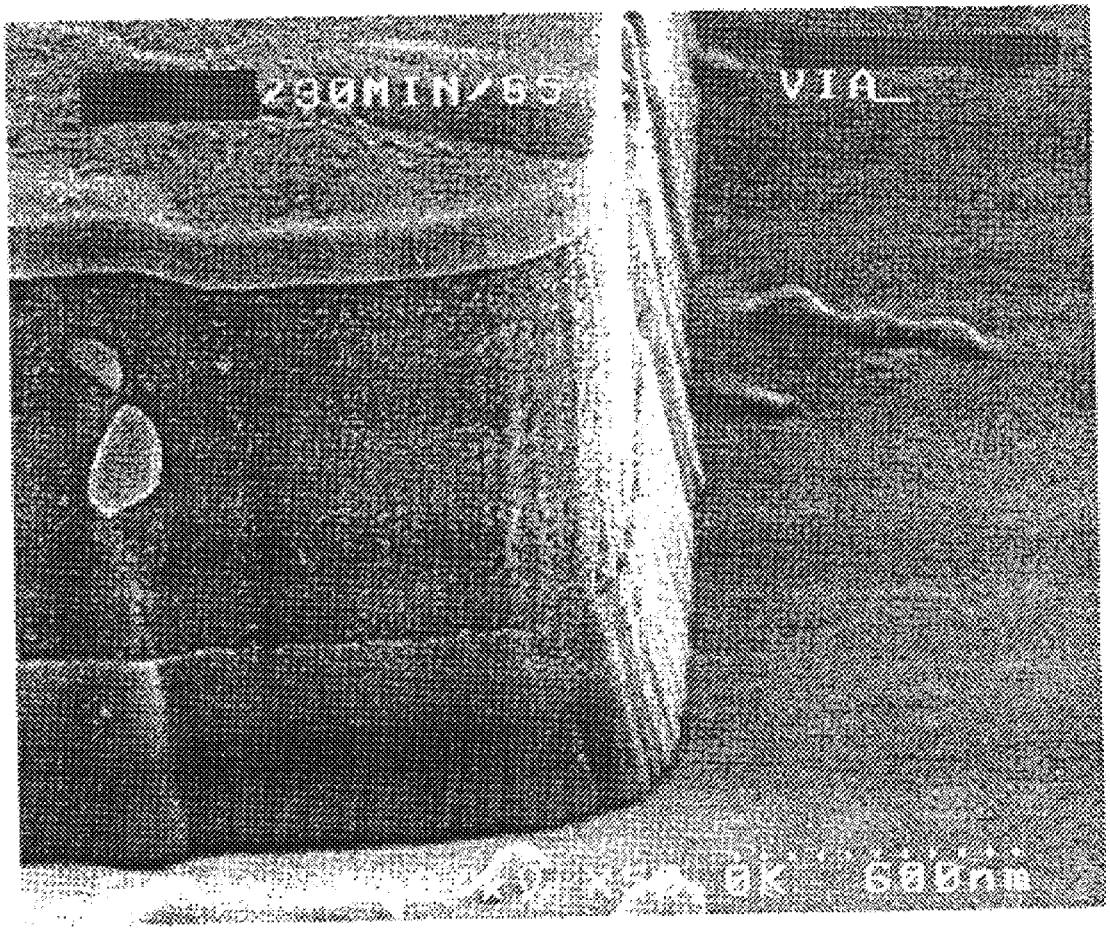

The procedures of Example 3 were repeated with composition D but at a cleaning temperature of 65° C. FIGS. 5A, 5B and 5C show the results obtained. A 90% cleaning of the ashed via wafer was obtained, as determined by visual observation of FIG. 5A. There was no metal corrosion. FIG. 5B shows almost complete cleaning of residue an unashed via wafer, with some residue only on the bottom of the via. FIG. 5C shows complete cleaning of the TiN/Al—Cu/Ti/TiN/Ti stack wafer, with no metal corrosion.

EXAMPLE 6

Figure 6A:
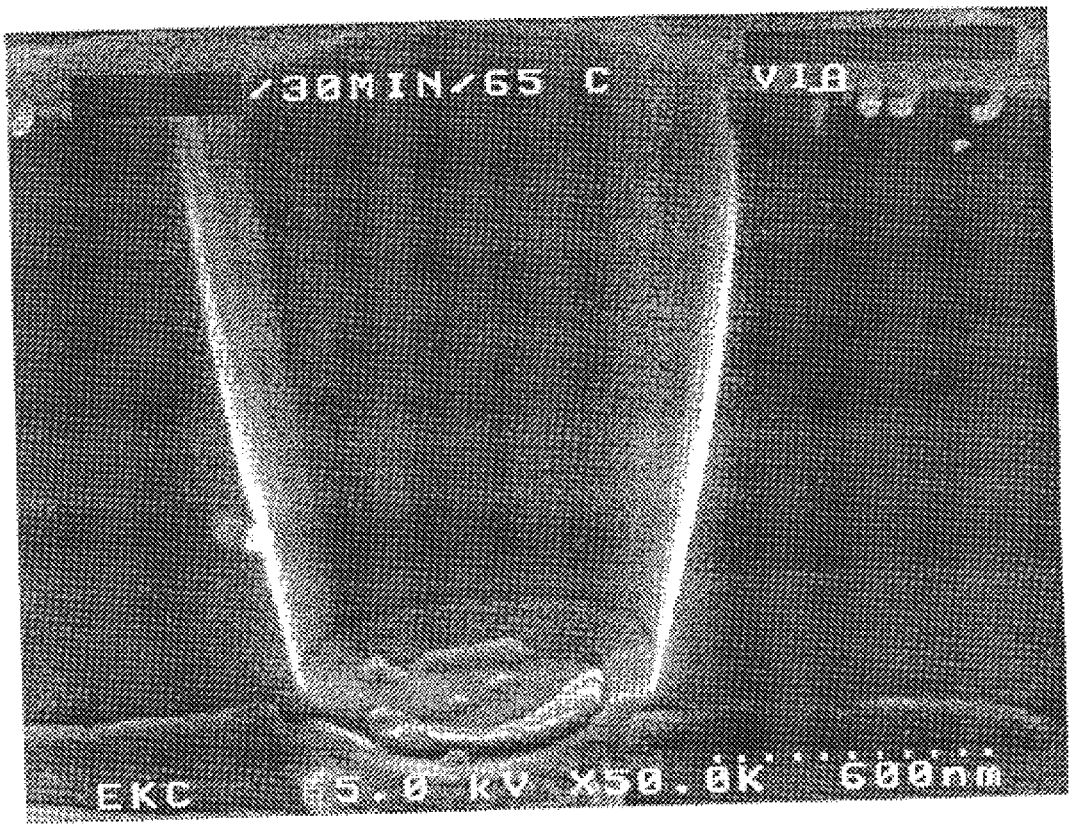
Figure 6B:
Figure 6C:
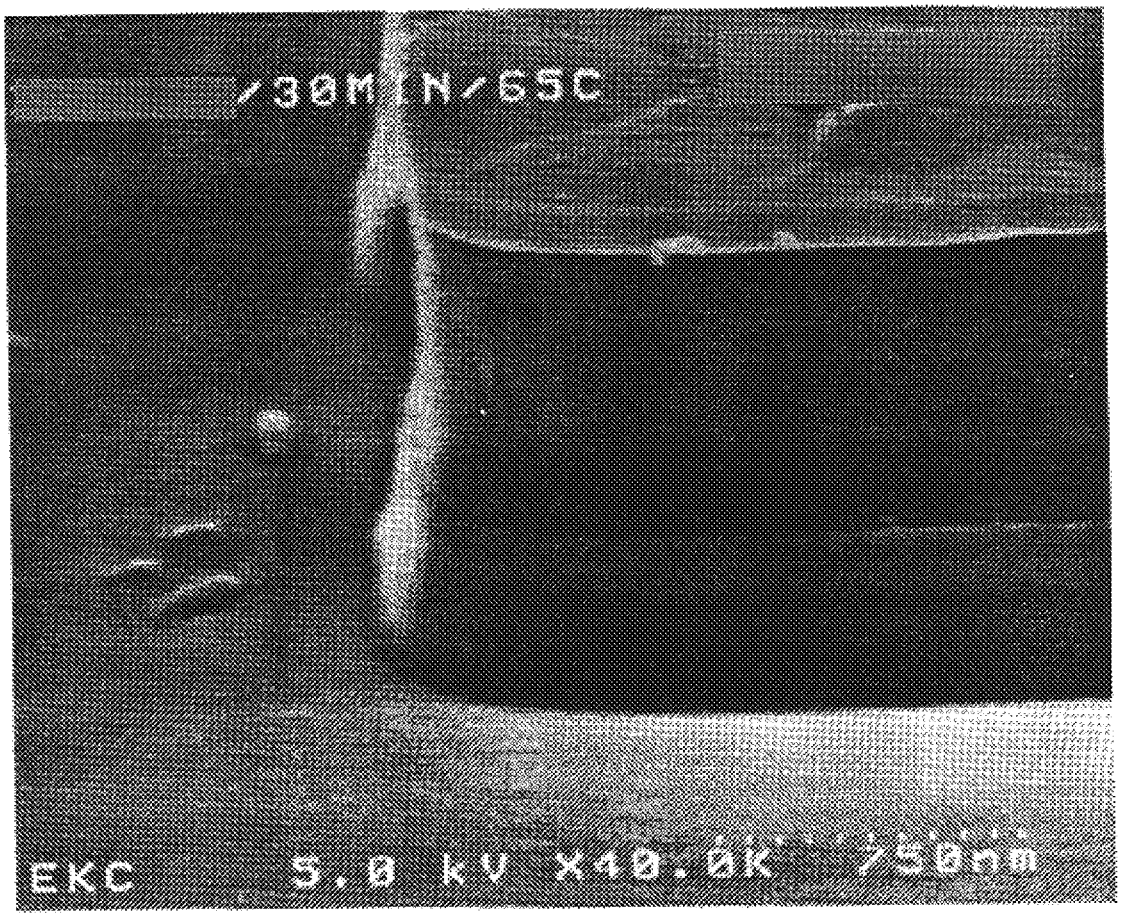

The procedures of Example 5 were repeated with composition E. FIGS. 6A, 6B and 6C show the results obtained. Surface and sidewall cleaning of the ashed via wafer, with residue only on the bottom of the via was obtained, as determined by visual observation of FIG. 6A. There was no metal corrosion. FIG. 6B shows complete cleaning of residue on the surface and sidewall of the via of the no-ash wafer, with some residue only on the bottom of the via, with no metal corrosion. FIG. 6C shows complete cleaning of the TiN/Al—Cu—Si/Ti stack wafer.

EXAMPLE 7

Figure 7A:
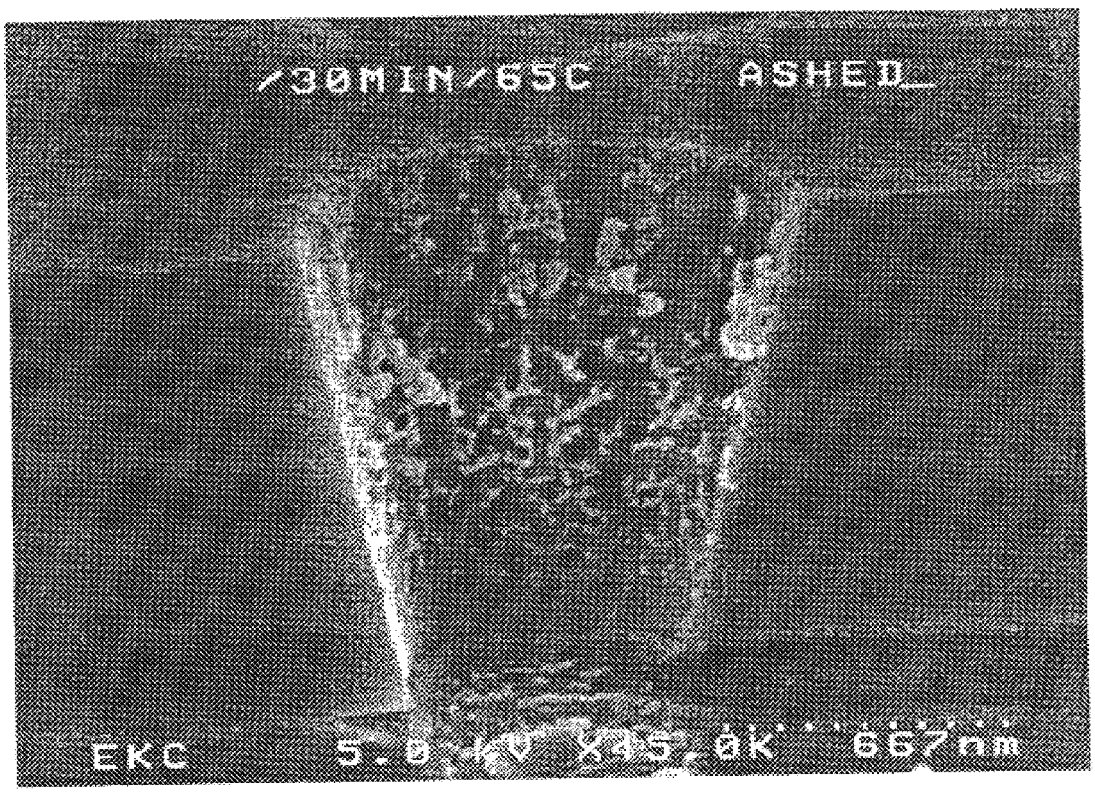
Figure 7B:
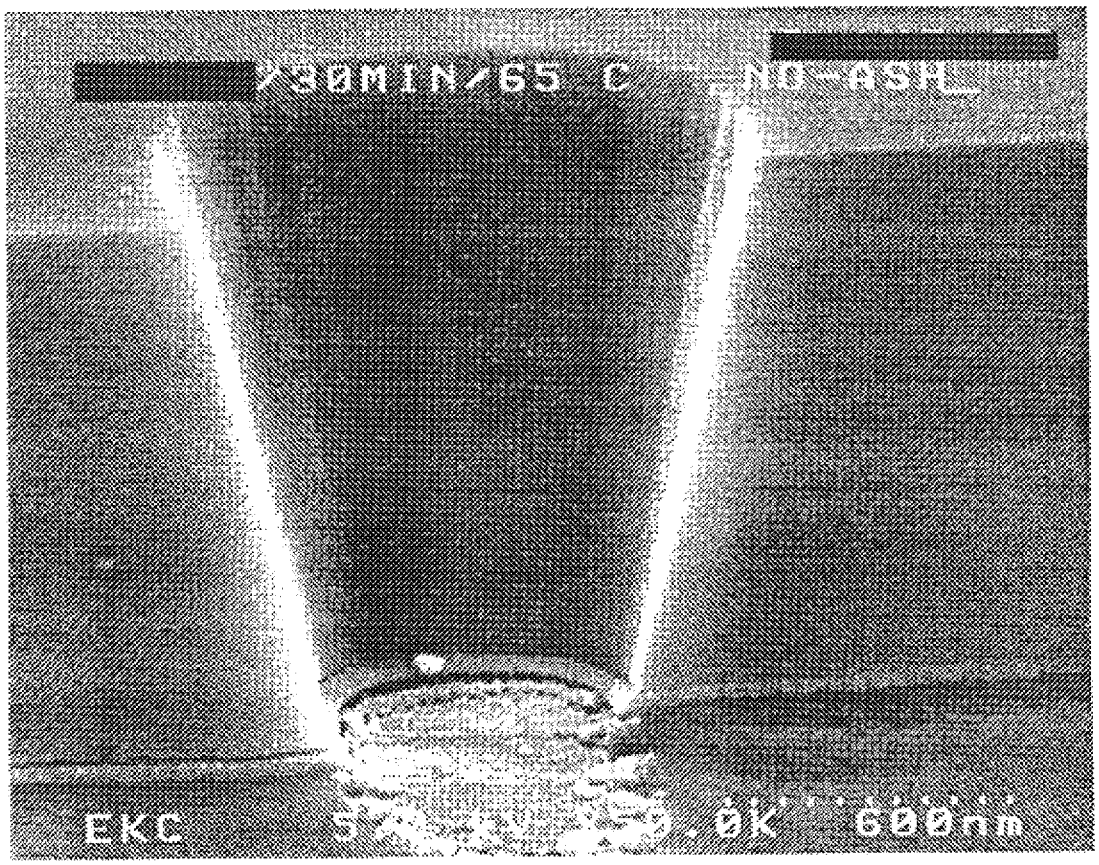
Figure 7C:
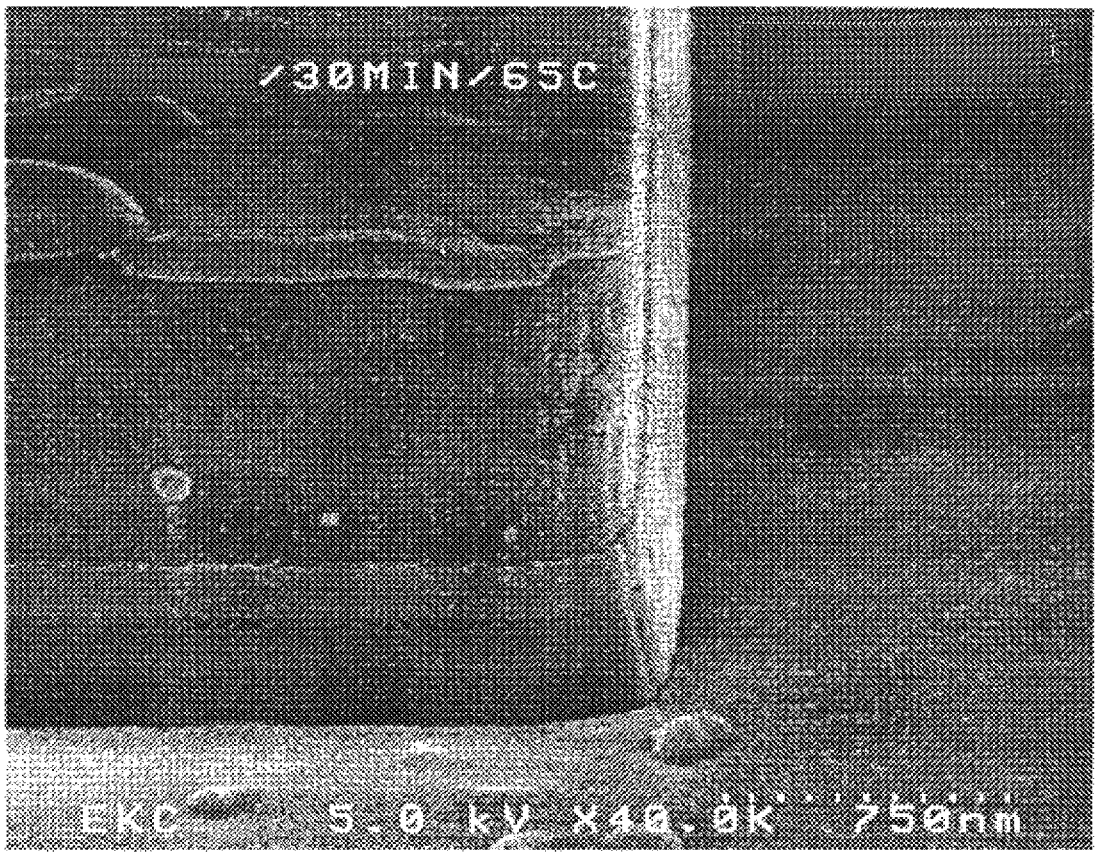

The procedures of Example 5 were repeated with composition F. FIGS. 7A, 7B and 7C show the results obtained. The sidewall and bottom of the via of the ashed via wafer were not quite cleaned, as determined by visual observation of FIG. 7A. There was no metal corrosion. FIG. 7B shows complete cleaning of residue on the no-ash wafer, with only a possible small aluminum undercut. FIG. 7C shows complete cleaning of the TiN/Al—Cu/Ti/TiN/Ti stack wafer, with no metal corrosion.

EXAMPLE 8

Figure 8A:
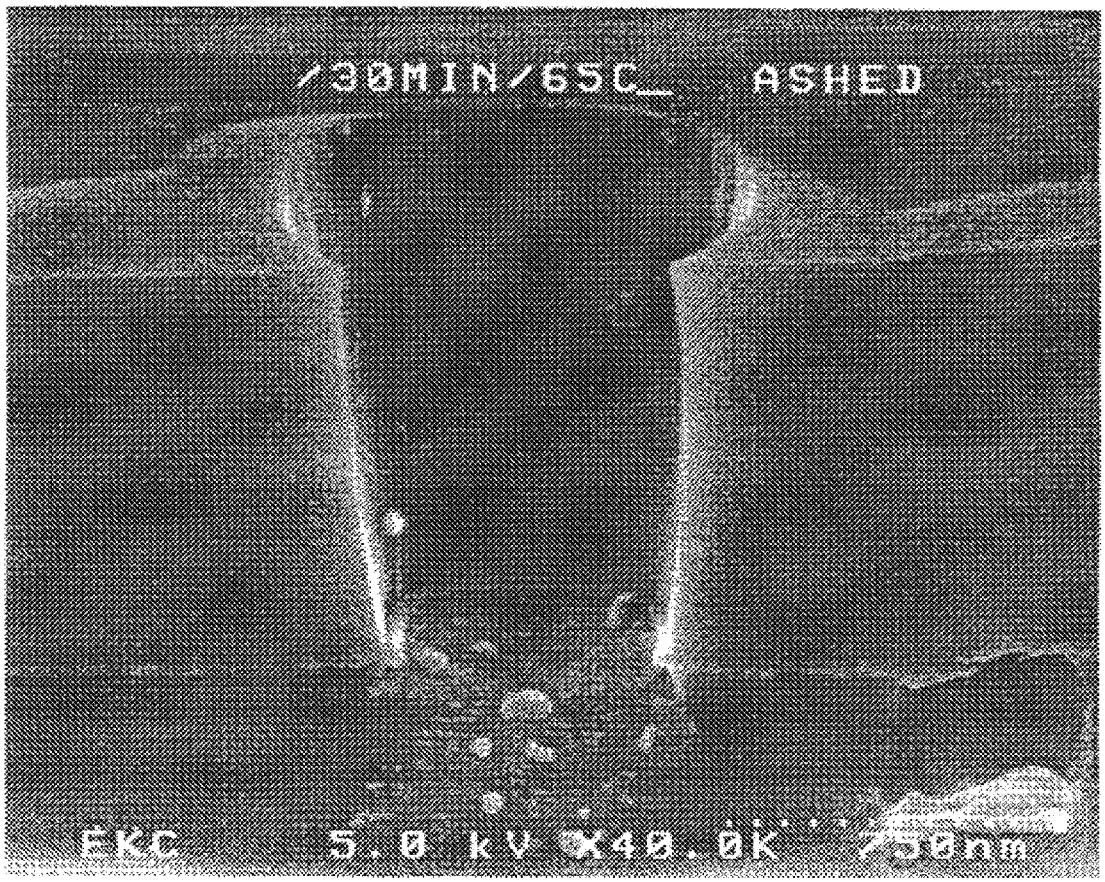
Figure 8B:
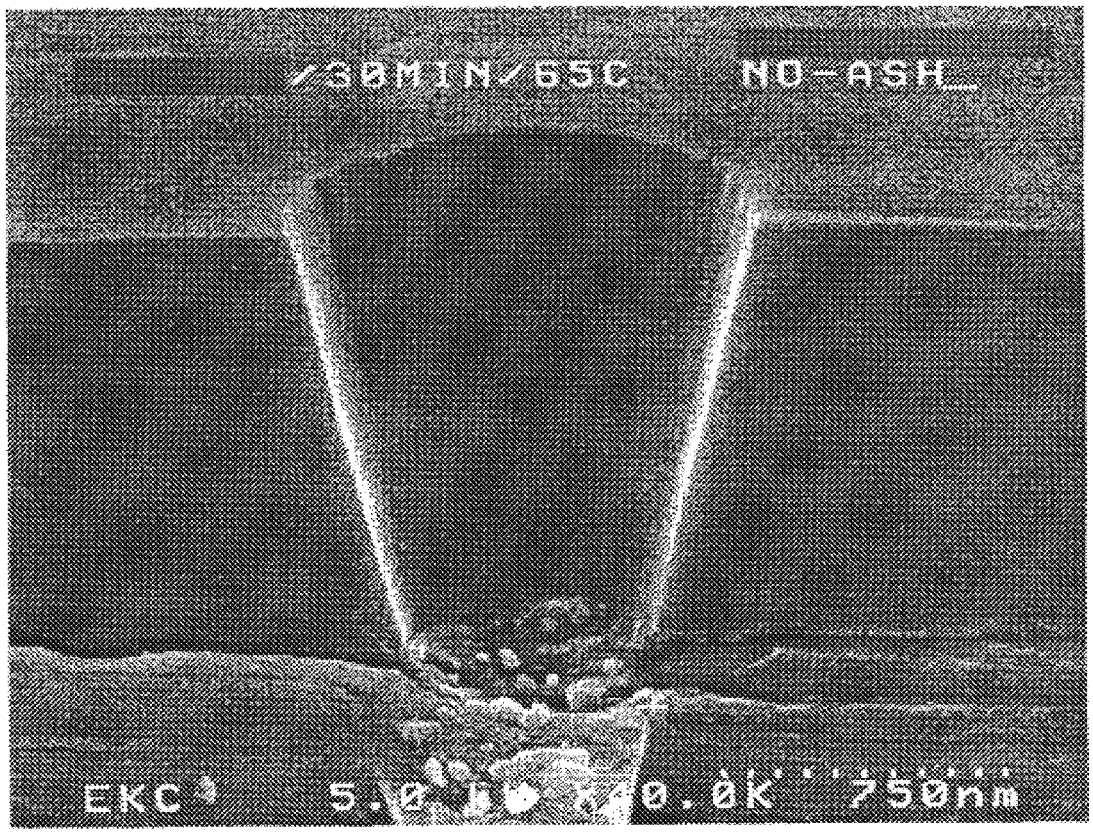
Figure 8C:
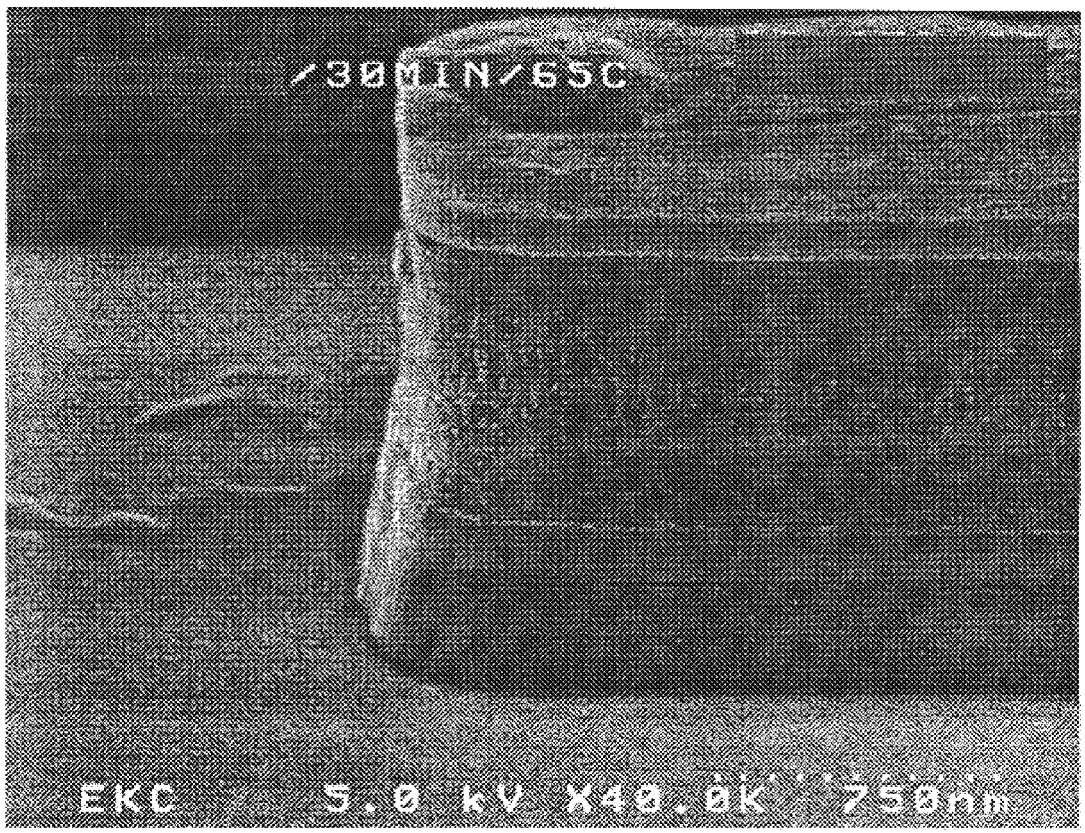

The procedures of Example 5 were repeated with composition G. FIGS. 8A, 8B and 8C show the results obtained. Surface and sidewall cleaning of the ashed via wafer, with residue only on the bottom of the via, was obtained, as determined by visual observation of FIG. 8A. There was no metal corrosion. FIG. 8B shows complete cleaning of residue on the surface and sidewall of the via of the no-ash wafer, with residue only on the bottom of the via, with no metal corrosion. FIG. 8C shows complete cleaning of the TiN/Ai—Cu/Ti/TiN/Ti stack wafer, with either no metal corrosion or just a start of titanium corrosion.

EXAMPLE 9

The procedure of Example 1 was repeated with composition H on three different wafer types. When composition H was mixed, a substantial amount of heat was generated, indicating the in situ formation of tetraammonium EDTA according to the equation:

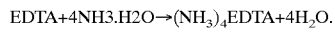

$$EDTA + 4NH_3.H_2O \rightarrow (NH_3)_4 EDTA + 4H_2O.$$

Figure 9A:
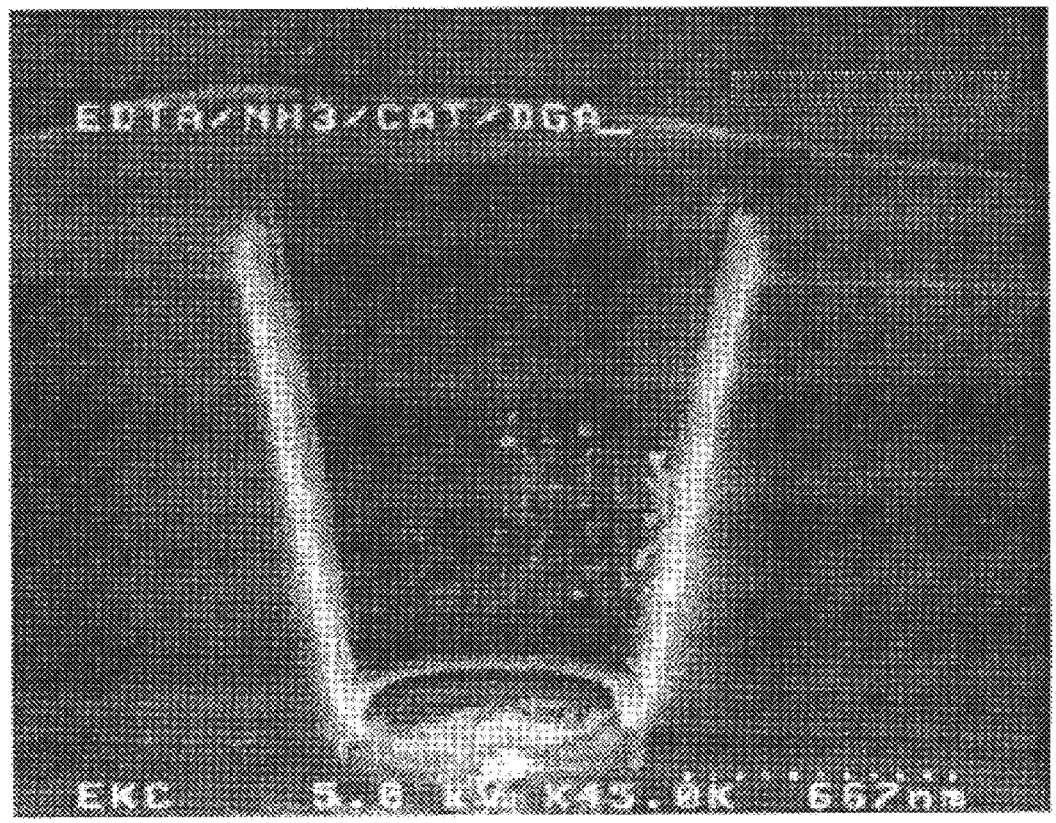
Figure 9B:
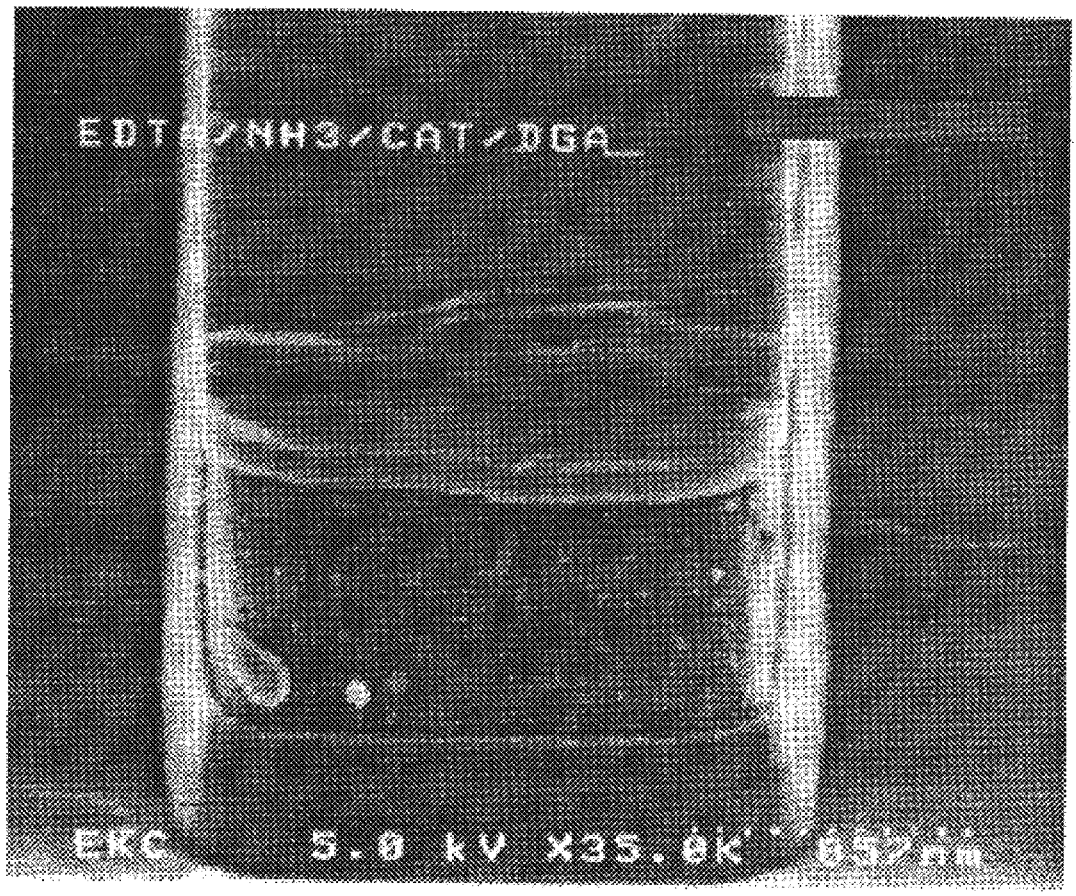
Figure 9C:
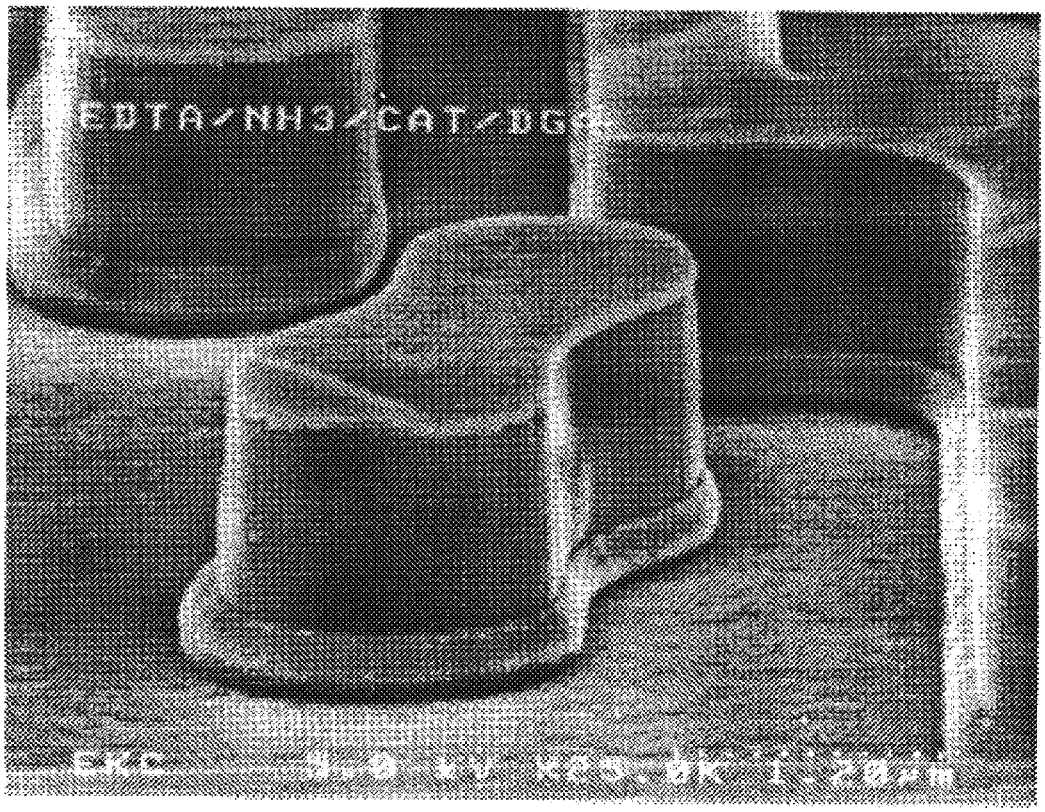

FIGS. 9A, 9B and 9C show the results obtained. The ashed via wafer was only about 80% cleaned, as determined by visual observation of FIG. 9A. Some bulk polymer strips were observed. The TiN/Al—Cu/Ti/TiN/Ti stack wafer was completely cleaned and showed no corrosion of either the aluminum or the titanium layers, as shown in FIG. 9B. The Ti/Al—Cu—Si/TiN stack was also completely cleaned with no aluminum or Ti corrosion, as shown in FIG. 9C.

It should now be readily apparent to those skilled in the art that a novel composition and process capable of achieving the stated objects of the invention has been provided. The improved ethylenediaminetetraacetic acid or a mono-, di-, tri- or tetraammonium salt thereof based composition and process using such a composition of this invention is suitable for meeting current semiconductor fabrication requirements. The composition and process is suitable for removing photoresist residues and other residues from wafers and other substrates including one or more titanium metal layers without substantial attack on such titanium layers.

It should further be apparent to those skilled in the art that various changes in form and details of the invention as shown and described may be made. It is intended that such changes be included within the spirit and scope of the claims appended hereto.

What is claimed is:

1. A process for removing photoresist from a substrate which comprises contacting the substrate with a composition comprising from about 17.5% to about 50% by weight of at least one ethylenediaminetetraacetic acid or a mono-, di-, tri- or tetraammonium salt thereof; from about 25% to about 75% by weight of a polar organic solvent; from about 0.15% to about 10% by weight of an ammonium salt selected from the group consisting of ammonium tartrate, ammonium citrate, ammonium formate, ammonium glucomate, ammonium fluoride, ammonium nitrate, ammonium thiosulfate, ammonium persulfate, ammonium bicarbonate, and ammonium phosphate and water, for a time and at a temperature sufficient to remove the photoresist or other polymeric material from the substrate.

2. The process of claim 1 wherein the time is from about 2 to about 60 minutes and the temperature is from room temperature to about 120 C.

3. The process of claim 1 wherein the composition further comprises at least one amine or alkanolamine.

4. The process of claim 1 wherein the ammonium salt of ethylenediaminetetraacetic acid is formed in the composition from ethylenediaminetetraacetic acid and ammonia.

5. The process of claim 1 wherein the composition further comprises an additional chelating agent.

6. The process of claim 5 wherein the additional chelating agent is catechol or gallic acid.

7. The process of claim 1 wherein the substrate comprises titanium.

8. The process of claim 1 wherein the substrate comprises a titanium layer of an integrated circuit.

9. The process of claim 3 wherein the at least one amine or alkanolamine is present in the composition in an amount of from about 25% to about 75% by weight.

10. The process of claim 3 wherein the at least one amine or alkanolamine is selected from the group consisting of ethylene diamine, diethylene triamine, 2-methyleneaminopropylenediamine, monoethanolamine, diethanolamine, triethanolamine, tertiarybutyldiethanolamine, isopropanolamine, diisopropanolamine, triisopropanolamine, 3-amino-1-propanol, isobutanolamine, 2-(2-aminoethoxy)ethanol, 2-amino-2-ethocy-propanol, methylethanol amine, and N,N-diethylene hydroxylamine.

11. The process of claim 6 wherein the additional chelating agent is present in the composition in an amount of from about 5% to about 25% by weight.

12. The process of claim 1 wherein the water is present in the composition in an amount of from about 25% to about 75% by weight.

13. The process of claim 1 wherein the organic polar solvent is selected from the group consisting of dimethyl sulfoxide, ethylene glycol, ethylene glycol alkyl ether, diethylene glycol alkyl ether, triethylene glycol alkyl ether, propylene glycol, propylene glycol alkyl ether, N-substituted pyrrolidone, sulfolane, and dimethyl acetamide.

14. A method for removing photoresist from a substrate which comprises contacting the substrate with a composition comprising from about 13% to about 50% by weight of at least one ethylenediaminetetraacetic acid or a mono-, di-, tri- or tetraammonium salt thereof; from about 25% to about 75% by weight of a polar organic solvent; from about 0.15% to about 10% by weight of an ammonium salt selected from the group consisting of ammonium tartrate, ammonium citrate, ammonium formate, ammonium glucomate, ammonium fluoride, ammonium nitrate, ammonium thiosulfate, ammonium persulfate, ammonium bicarbonate, and ammonium phosphate; and from about 5% to about 75% by weight water, for a time and at a temperature sufficient to remove the photoresist or other polymeric material from the substrate.

15. The method of claim 14 wherein the composition further comprises from about 25% to about 75% by weight of at least one amine or alkanolamine.

16. The method of claim 14 wherein the composition contains from about 17.5% to about 50% by weight of di-, tri-, or tetraammonium salt of ethylenediaminetetraacetic acid.

17. The method of claim 14 wherein the time is from about 2 to about 60 minutes and the temperature is from room temperature to about 120° C.

18. The method of claim 14 wherein the substrate comprises titanium.

19. The method of claim 14 wherein the substrate comprises a titanium layer of an integrated circuit.

20. The method of claim 15 wherein the at least one amine or alkanolamine is selected from the group consisting of ethylene diamine, diethylene triamine, 2-methyleneaminopropylenediamine, monoethanolamine, diethanolamine, triethanolamine, tertiarybutyldiethanolamine, isopropanolamine, diisopropanolamine, triisopropanolanine, 3-amino-1-propanol, isobutanolamine, 2-(2-aminoethoxy)ethanol, 2-amino-2-ethoxy-propanol, methylethanol amine, and N,N-diethylene hydroxylamine.

21. The method of claim 14 wherein the organic polar solvent is selected from the group consisting of dimethyl sulfoxide, ethylene glycol, ethylene glycol alkyl ether, diethylene glycol alkyl ether, triethylene glycol alkyl ether, propylene glycol, propylene glycol alkyl ether, N-substituted pyrrolidone, sulfolane, and dimethyl acetamide.

* * * * *